(12) United States Patent
Zeng

(10) Patent No.: US 10,431,176 B2
(45) Date of Patent: Oct. 1, 2019

(54) SCANNING-DRIVING CIRCUIT AND LIQUID CRYSTAL DISPLAY (LCD)

(71) Applicant: Shenzhen China Star Optoelectronics Semiconductor Display Technology Co., Ltd., Shenzhen, Guangdong (CN)

(72) Inventor: Mian Zeng, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 92 days.

(21) Appl. No.: 15/739,768

(22) PCT Filed: Nov. 23, 2017

(86) PCT No.: PCT/CN2017/112443
§ 371 (c)(1),
(2) Date: Dec. 25, 2017

(87) PCT Pub. No.: WO2019/041586
PCT Pub. Date: Mar. 7, 2019

(65) Prior Publication Data
US 2019/0073977 A1    Mar. 7, 2019

(30) Foreign Application Priority Data
Sep. 4, 2017   (CN) ............................ 20171078921.9

(51) Int. Cl.
*G09G 3/36*   (2006.01)
*G02F 1/133*  (2006.01)

(52) U.S. Cl.
CPC ....... *G09G 3/3674* (2013.01); *G02F 1/13306* (2013.01); *G09G 2310/0264* (2013.01); *G09G 2310/08* (2013.01)

(58) Field of Classification Search
CPC .. G09G 3/3674; G09G 3/3677; G09G 3/3266; G11C 19/28
See application file for complete search history.

(56) References Cited

U.S. PATENT DOCUMENTS 9,257,198 B2   2/2016  Yan
9,940,889 B2 * 4/2018  Park ..................... G09G 3/3677
(Continued)

FOREIGN PATENT DOCUMENTS

CN        101937718 A       1/2011
CN        105609135 A       5/2016
(Continued)

*Primary Examiner* — Sepehr Azari
(74) *Attorney, Agent, or Firm* — Andrew C. Cheng

(57) ABSTRACT

The present disclosure relates to a scanning-driving circuit and a liquid crystal display (LCD). The scanning-driving circuit includes: a plurality of cascaded-connected gate driver on array (GOA) units. Each of the GOA units includes a pull-up circuit, a controlling circuit, a down-transfer circuit, a pull-down circuit, and a pull-down maintaining unit. The controlling circuit includes a first controlling circuit and a second controlling circuit. When conducting a forward scanning process, the first controlling circuit is configured to turn on the pull-up circuit upon the scanning process has started, and the second controlling circuit is configured to turn off the pull-up circuit upon the scanning process has finished. When conducting a backward scanning process, the second controlling circuit is configured to turn on the pull-up circuit upon the scanning process has started, and the first controlling circuit is configured to turn off the pull-up circuit upon the scanning process has finished.

14 Claims, 5 Drawing Sheets

(56) References Cited

U.S. PATENT DOCUMENTS

| | | | | |
|---|---|---|---|---|
| 2015/0029082 A1* | 1/2015 | Jeon | ................... | G11C 19/28 |
| | | | | 345/98 |
| 2015/0206490 A1* | 7/2015 | Lim | ................. | G09G 3/3677 |
| | | | | 345/92 |
| 2016/0140922 A1* | 5/2016 | Dai | .................... | G11C 19/287 |
| 2016/0164514 A1* | 6/2016 | Xiao | ................. | H03K 17/687 |
| | | | | 327/109 |
| 2016/0343336 A1* | 11/2016 | Dai | .................... | G11C 19/184 |
| 2017/0132984 A1* | 5/2017 | Dai | .................... | G09G 3/3677 |
| 2018/0294040 A1* | 10/2018 | Hao | ................... | G11C 19/28 |

FOREIGN PATENT DOCUMENTS

| | | |
|---|---|---|
| CN | 106098011 A | 11/2016 |
| CN | 106601205 A | 4/2017 |
| CN | 106898290 A | 6/2017 |
| CN | 107103887 A | 8/2017 |
| JP | 5078533 B2 | 11/2012 |

\* cited by examiner

SCANNING-DRIVING CIRCUIT AND LIQUID CRYSTAL DISPLAY (LCD)

BACKGROUND

1. Technical Field

The present disclosure relates to a display field, and more particularly to a scanning-driving circuit and a liquid crystal display (LCD).

2. Description of Related Art

The gate driver on array (GOA) is a technique adopts the conventional manufacturing process of the liquid crystal display (LCD) array of the thin film transistors (TFTs) to manufacture the gate of the row-scanning-driving signal circuit onto the array substrate. As such, the gate of the TFTs may be scanned in a row by row manner.

However, the conventional GOA circuit may only scan in one-way direction. With respect to the GOA circuit capable of scanning in bi-direction, the structure may be more complicated and the power consumption may be high.

SUMMARY

The present disclosure relates to a display device, including: a scanning-driving circuit, including: a plurality of cascaded-connected gate driver on array (GOA) units, wherein each of the GOA units includes a pull-up circuit, a controlling circuit, a down-transfer circuit, a pull-down circuit, and a pull-down maintaining unit, and the controlling circuit includes a first controlling circuit and a second controlling circuit; when conducting a forward scanning process, the first controlling circuit is configured to turn on the pull-up circuit upon the scanning process has started, and the second controlling circuit is configured to turn off the pull-up circuit upon the scanning process has finished; when conducting a backward scanning process, the second controlling circuit is configured to turn on the pull-up circuit upon the scanning process has started, and the first controlling circuit is configured to turn off the pull-up circuit upon the scanning process has finished; the pull-up circuit includes: a first transistor, a control end of the first transistor connects to the first controlling circuit and the second controlling circuit, a first end of the first transistor is configured to input first clock signals, and a second end of the first transistor is configured to output scanning signals; a bootstrap capacitor, a first end of the bootstrap capacitor connects to the control end of the first transistor, and a second end of the bootstrap capacitor connects to the second end of the first transistor; the down-transfer circuit includes a second transistor, a control end of the second transistor connects to the first controlling circuit and the second controlling circuit, a first end of the second transistor is configured to input the first clock signals, and a second end of the second transistor outputs down-transfer signals; wherein the first transistor and the second transistor are thin film transistors (TFTs) made of indium gallium zinc oxide (IGZO) material.

The present disclosure relates to a scanning driving circuit, including: a plurality of cascaded-connected GOA units, wherein each of the GOA units includes a pull-up circuit, a controlling circuit, a down-transfer circuit, a pull-down circuit, and a pull-down maintaining unit, and the controlling circuit includes a first controlling circuit and a second controlling circuit; when conducting a forward scanning process, the first controlling circuit is configured to turn on the pull-up circuit upon the scanning process has started, and the second controlling circuit is configured to turn off the pull-up circuit upon the scanning process has finished; when conducting a backward scanning process, the second controlling circuit is configured to turn on the pull-up circuit upon the scanning process has started, and the first controlling circuit is configured to turn off the pull-up circuit upon the scanning process has finished.

The present disclosure relates to a display device, including: a scanning driving circuit including: a plurality of cascaded-connected GOA units, wherein each of the GOA units includes a pull-up circuit, a controlling circuit, a down-transfer circuit, a pull-down circuit, and a pull-down maintaining unit, and the controlling circuit includes a first controlling circuit and a second controlling circuit; when conducting a forward scanning process, the first controlling circuit is configured to turn on the pull-up circuit upon the scanning process has started, and the second controlling circuit is configured to turn off the pull-up circuit upon the scanning process has finished; when conducting a backward scanning process, the second controlling circuit is configured to turn on the pull-up circuit upon the scanning process has started, and the first controlling circuit is configured to turn off the pull-up circuit upon the scanning process has finished.

In view of the above, the scanning-driving circuit may include a plurality of the cascaded-connected GOA units. Each of the GOA units may include the pull-up circuit, the controlling circuit, the down-transfer circuit, the pull-down circuit, and the pull-down maintaining unit. The controlling circuit may include the first controlling circuit and the second controlling circuit. When conducting the forward scanning process, the first controlling circuit is configured to turn on the pull-up circuit at the first level upon the scanning process conducted on the GOA at the first level has started. The second controlling circuit is configured to turn off the pull-up circuit at the first level upon the scanning process conducted on the GOA at the first level has finished. Specifically, when conducting the backward scanning process, the second controlling circuit is configured to turn on the pull-up circuit at the first level upon the scanning process conducted on the GOA at the first level has started. The first controlling circuit is configured to turn off the pull-up circuit at the first level upon the scanning process conducted on the GOA at the first level has finished. The first controlling circuit may conduct the pull-up process on the control end of the pull-up circuit and the down-transfer circuit when conducting the forward scanning process, and the first controlling circuit may conduct the pull-down process on the control end of the pull-up circuit and the down-transfer circuit when conducting the backward scanning process. The second controlling circuit may conduct the pull-down process on the control end of the pull-up circuit and the down-transfer circuit when conducting the forward scanning process, and the second controlling circuit may conduct the pull-up process on the control end of the pull-up circuit and the down-transfer circuit when conducting the backward scanning process. As such, the first controlling circuit and the second controlling circuit may perform different operations when the scanning-driving circuit conducts the scanning process in different directions. So as to simplify the structure of the circuit, and to reduce the power consumption.

DETAILED DESCRIPTION

To clarify the purpose, technical solutions, and the advantages of the disclosure, embodiments of the invention will now be described more fully hereinafter with reference to the accompanying drawings.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

The term "embodiment" in the present disclosure indicates the specific feature, structure, or feature may be included in at least one embodiment of the present disclosure. The terms appear in the specification may not indicate the same embodiment, and may not indicate that the embodiment is independent from, alternative, or exclusive from other embodiments. The person skilled in the art may understand, the embodiment of the present disclosure may be combined with other embodiments.

Figure 1:
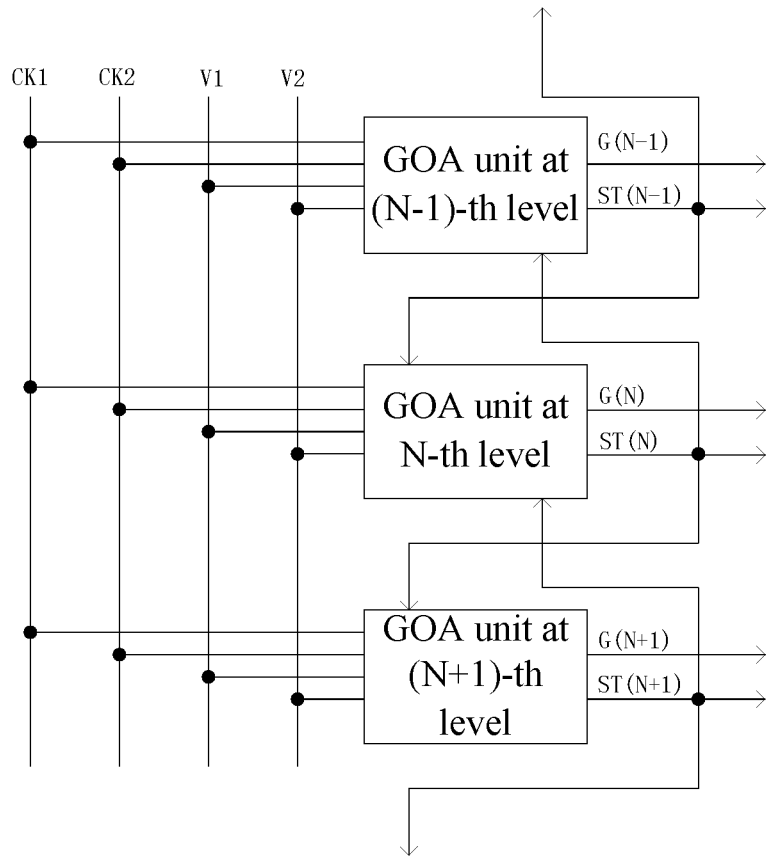
FIG. 1 is a schematic view of a scanning-driving circuit in accordance with one embodiment of the present disclosure.

Referring to FIG. 1, the present disclosure relates to a scanning-driving circuit, including a plurality of cascaded-connected gate driver on array (GOA) units.

Taking a GOA unit at a (N−1)-th level, a GOA unit at a N-th level, and a GOA unit at a (N+1)-th level as an example. The GOA unit at the (N−1)-th level, the GOA unit at the N level, and the GOA unit at the (N+1)-th level are cascaded-connected. The GOA unit at each level may scan each of scanning lines in sequence to conduct a driving process. The GOA unit may output high potential scanning signals and level-transfer signals during the driving process.

For example, when the GOA unit at the N-th level conducts the driving process, the GOA unit at the N-th level may output the high potential scanning signal at the N-th level G(N) and the level-transfer signals at the N-th level ST(N). The high potential scanning signal at the N-th level G(N) is configured to turn on thin film transistors (TFTs) within each of pixels configured in one row, and to conduct a recharging process on pixel electrodes within each of the pixels. The level-transfer signals at the N-th level ST(N) is configured to provide the level-transfer signals to a previous level when conducting a forward scanning process, and to provide the level-transfer signals to a next level when conducing a backward scanning process.

The GOA at each level may require clock signals, control signals, and so on. In one example, a first clock signals CK, a second clock signals XCK, a first control signals V1, and a second control signals V2 may be provided.

Figure 2:
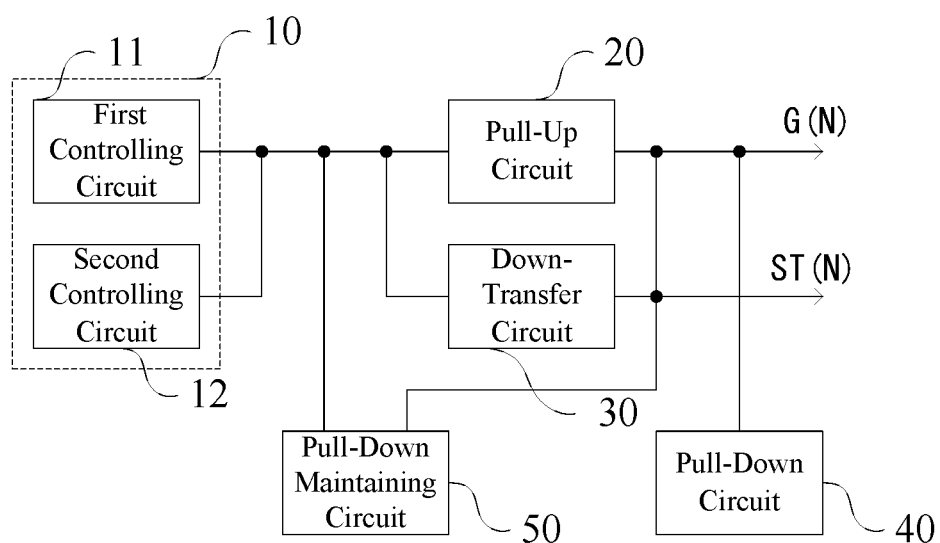
FIG. 2 is a schematic view of a gate driver on array (GOA) unit within a scanning-driving circuit in accordance with one embodiment of the present disclosure.

Referring to FIG. 2, the GOA unit may include a controlling circuit 10, a pull-up circuit 20, a down-transfer circuit 30, a pull-down circuit 40, and a pull-down maintaining unit 50.

The controlling circuit 10 may include a first controlling circuit 11 and a second controlling circuit 12.

The first controlling circuit 11 connects to the pull-up circuit 20 and the down-transfer circuit 30. The second controlling circuit 12 connects to the pull-up circuit 20 and the down-transfer circuit 30. The pull-up circuit 20 is configured to output scanning signals G(N). The down-transfer circuit 30 is configured to output the level-transfer signals ST(N).

When conducting the forward scanning process, the first controlling circuit 11 is configured to turn on the pull-up circuit 20 upon the scanning process has started, and the second controlling circuit 12 is configured to turn off the pull-up circuit 20 upon the scanning process has finished. When conducting the backward scanning process, the second controlling circuit 12 is configured to turn on the pull-up circuit 20 upon the scanning process has started, and the first controlling circuit 11 is configured to turn off the pull-up circuit 20 upon the scanning process has finished.

The pull-up circuit 20 may output the scanning signals G(N) when being activated. The scanning signals G(N) may be provided by the clock signals.

The down-transfer circuit 30 is similar to the pull-up circuit 20. When conducting the forward scanning process, the first controlling circuit 11 is configured to turn on the down-transfer circuit 30 upon the scanning process has started, and the second controlling circuit 12 is configured to turn off the down-transfer circuit 30 upon the scanning process has finished. When conducting the backward scanning process, the second controlling circuit 12 is configured to turn on the down-transfer circuit 30 upon the scanning process has started, and the first controlling circuit 11 is configured to turn off the down-transfer circuit 30 upon the scanning process has finished.

The down-transfer circuit 30 may output the level-transfer signals ST(N) when activating. The level-transfer signals ST(N) may be provided by the clock signals.

The pull-down circuit 40 connects to a scanning signal output end of he pull-up circuit 20. The pull-down circuit 40 is configured to pull-down the scanning signals G(N) to a low potential when the scanning process has finished. As such, the TFTs within the pixels in one row may be turned off, and the pixel electrodes within each of the pixels may start a discharging process.

The pull-down maintaining circuit 50 connects with a control end of the pull-up circuit 20 and a control end of the down-transfer circuit 30. The pull-down maintaining circuit 50 is configured to turn off the pull-up circuit 20 and the down-transfer circuit 30 when the scanning process conducted on one row has finished. In one example, the pull-down maintaining circuit 50 may further connect to a scanning signal output end of the pull-up circuit 20 and a down-transfer signal output end of the down-transfer circuit 30. The pull-down maintaining circuit 50 is configured to pull-down the scanning signals and the down-transfer signals to the low potential.

In view of the above, the first controlling circuit 11 may conduct the pull-up process on the control end of the pull-up circuit 20 and the down-transfer circuit 30 when conducting the forward scanning process, and the first controlling circuit 11 may conduct the pull-down process on the control end of the pull-up circuit 20 and the down-transfer circuit 30 when conducting the backward scanning process. The second controlling circuit 12 may conduct the pull-down process on the control end of the pull-up circuit 20 and the down-transfer circuit 30 when conducting the forward scanning process, and the second controlling circuit 12 may conduct the pull-up process on the control end of the pull-up circuit 20 and the down-transfer circuit 30 when conducting the backward scanning process. As such, the first controlling circuit 11 and the second controlling circuit 12 may perform different operations when the scanning-driving circuit conducts the scanning process in different directions. So as to simplify the structure of the circuit and to reduce the power consumption.

Figure 3:
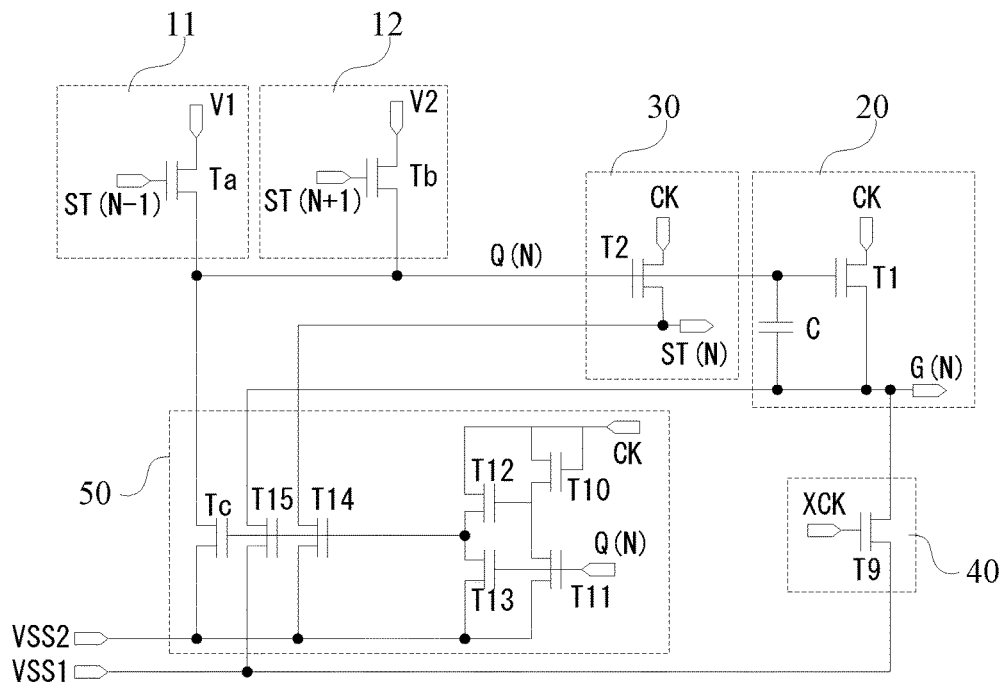
FIG. 3 is a schematic view of a scanning-driving circuit in accordance with another embodiment of the present disclosure.

In another example, referring to FIG. 3, the present disclosure relates to the scanning-driving circuit, including a plurality of the GOA units (as shown in FIG. 1). Each of the GOA units may include the controlling circuit 10, the pull-up circuit 20, the down-transfer circuit 30, the pull-down circuit 40, and the pull-down maintaining unit 50 (as shown in FIG. 2).

The pull-up circuit 20 may include a first transistor T1. A control end of the first transistor T1 connects to the first controlling circuit 11 and the second controlling circuit 12. A first end of the first transistor T1 is configured to input the first clock signals CK, and a second end of the first transistor T1 is configured to output the scanning signals G(N). The pull-up circuit 20 may further include a bootstrap capacitor C. A first end of the bootstrap capacitor C connects to the control end of the first transistor T1, and a second end of the bootstrap capacitor C connects to the second end of the first transistor T1. The down-transfer circuit 12 may include a second transistor T2. A control end of the second transistor T2 connects to the first controlling circuit 11 and the second controlling circuit 12. A first end of the second transistor T2 is configured to input the first clock signals CK, and a second end of the second transistor T2 is configured to output the down-transfer signals ST(N).

When the control end Q(N) of the first transistor T1 is at a high potential, the first transistor T1 may be turned on. The first clock signals CK inputted from the first end of the first transistor T1 may be outputted from the second end of the first transistor T1 to form the scanning signals G(N). When the control end Q(N) of the first transistor T1 is at the low potential, the first transistor T1 may be turned off.

When the control end Q(N) of the second transistor T2 is at the high potential, the second transistor T2 may be turned on. The first clock signals CK inputted from the first end of the second transistor T2 may be outputted from the second end of the second transistor T2 to form the level-transfer signals ST(N). When the control end Q(N) of the second transistor T2 is at the low potential, the second transistor T2 may be turned off.

The first controlling circuit 11 may include a first switch unit Ta. A control end of the first switch unit Ta connects to an output end of the down-transfer circuit of a GOA unit at the previous level to input down-transfer signals ST(N−1), wherein the input down-transfer signals ST(N−1) are outputted from the down-transfer circuit at the previous level. A first end of the first switch unit Ta is configured to input the first control signals V1, and a second end of the first switch unit Ta connects to the control end of the first transistor T1. The control end of the first switch unit Ta of the GOA unit at a first level is configured to input STV signals.

The second controlling circuit 12 may include a second switch unit Tb. A control end of the second switch unit Tb connects to the output end of the down-transfer circuit of a GOA unit at the next level to input the down-transfer signals ST(N+1), wherein the down-transfer signals ST(N+1) are outputted from the down-transfer circuit at the next level. A first end of the second switch unit Tb is configured to input the second control signals V2, and a second end of the second switch unit Tb connects to the control end of the first transistor T1. The control end of the second switch unit Tb of the GOA unit at a last level is configured to input the STV signals.

During the forward scanning process, the first control signals V1 may be high potential signals, and the second control signals V2 may be low potential signals. During the backward scanning process, the first control signals V1 may be low potential signals, and the second control signals V2 may be high potential signals.

When conducting the forward scanning process, the down-transfer signals ST(N−1) outputted from the down-transfer circuit of the GOA unit at the previous level are at the high potential, and the first switch unit Ta may be turned on. The first control signals V1 inputted from the first end of the first switch unit Ta may be at the high potential. As such, Q(N) may be at the high potential, and the first transistor T1 and the second transistor T2 may be turned on. When the forward scanning process is finished, the down-transfer signals ST(N+1) outputted from the down-transfer circuit of the GOA unit at the next level are at the high potential, and the second switch unit Tb may be turned on. The second control signals V2 inputted from the first end of the second switch unit Tb may be at the low potential. As such, Q(N) may be at the low potential, and the first transistor T1 and the second transistor T2 may be turned off.

When conducting the backward scanning process, the down-transfer signals ST(N+1) outputted from the down-transfer circuit of the GOA unit at the next level are at the high potential, and the second switch unit Tb may be turned on. The second control signals V2 inputted from the first end of the second switch unit Tb may be at the high potential. As such, Q(N) may be at the high potential, and the first transistor T1 and the second transistor T2 may be turned on. When the backward scanning process is finished, the down-transfer signals ST(N−1) outputted from the down-transfer circuit of the GOA unit at the previous level are at the high potential, and the first switch unit Ta may be turned on. The first control signals V1 inputted from the first end of the first switch unit Ta may be at the low potential. As such, Q(N) may be at the low potential, and the first transistor T1 and the second transistor T2 may be turned off.

The pull-down circuit 40 may include a ninth transistor T9. A control end of the ninth transistor T9 is configured to input the second clock signals XCK. A first end of the ninth transistor T9 is configured to input first low potential signals VSS1. A second end of the ninth transistor T9 connects to the second end of the first transistor T1.

When the scanning signals G(N) had been transmitted, the first clock signals CK may be at the low potential, and the second clock signals XCK may be at the high potential. As such, the ninth transistor T9 may be turned on to pull-down the scanning signals G(N).

The first clock signals CK are opposite to the second clock signals XCK.

The pull-down maintaining circuit 50 may include: a tenth transistor T10, an eleventh transistor T11, a twelfth transistor T12, a thirteenth transistor T13, a fourteenth transistor T14, a fifteenth transistor T15, and a third switch unit Tc. A control end of the tenth transistor T10 is configured to input the first clock signals CK. A control end of the eleventh transistor T11 connects to the control end of the first transistor T1, a first end of the eleventh transistor T11 is configured to input second low potential signals VSS2, and a second end of the eleventh transistor T11 connects to a second end of the tenth transistor T10. A control end of the twelfth transistor T12 connects to the second end of the tenth transistor T10, a first end of the twelfth transistor T12 is configured to input the first clock signals CK. A control end of the thirteenth transistor T13 connects to the control end of the first transistor T1, a first end of the thirteenth transistor T13 is configured to input the second low potential signals VSS2, and a second end of the thirteenth transistor T13 connects to a second end of the twelfth transistor T12. A control end of the fourteenth transistor T14 connects to the second end of the twelfth transistor T12, a first end of the fourteenth transistor T14 is configured to input the second low potential signals VSS2, and a second end of the fourteenth transistor T14 connects to the second end of the second transistor T2. A control end of the fifteenth transistor T15 connects to the second end of the twelfth transistor T12, a first end of the fifteenth transistor T15 is configured to input the first low potential signals VSS1, and a second end of the fifteenth transistor T15 connects to the second end of the first transistor T1. A control end of the third switch unit Tc connects to the second end of the twelfth transistor T12, a first end of the third switch unit Tc is configured to input the second low potential signals VSS2, and a second end of the third switch unit Tc connects to the control end of the first transistor T1.

The pull-down maintaining circuit 50 is configured to pull-down a potential of Q(N), the scanning signals G(N), and the level-transfer signals ST(N).

Figure 4:
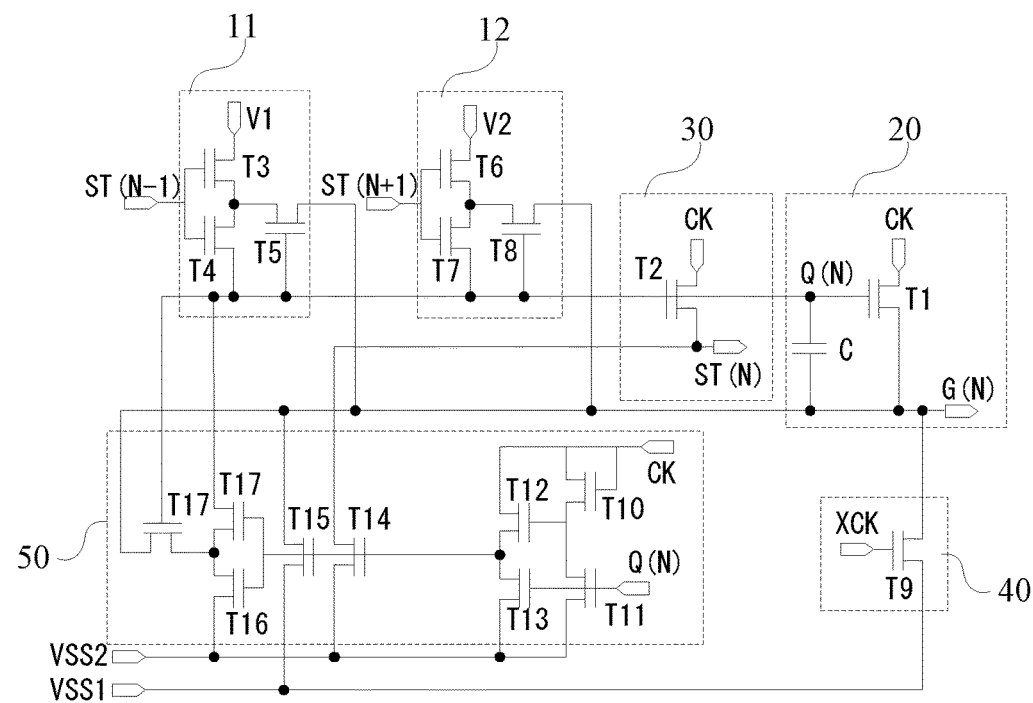
FIG. 4 is a schematic view of a scanning-driving circuit in accordance with another embodiment of the present disclosure.

In another example, referring to FIG. 4, the present disclosure relates to the scanning-driving circuit, including a plurality of the GOA units. Each of the GOA units may include the controlling circuit 10, the pull-up circuit 20, the down-transfer circuit 30, the pull-down circuit 40, and the pull-down maintaining unit 50.

The pull-up circuit 20, the down-transfer circuit 30, and the pull-down circuit 40 are the same with that of the embodiment described in above.

The first switch unit Ta may include: a third transistor T3, a fourth transistor T4, and a fifth transistor T5. A control end of the third transistor T3 connects to the output end of the down-transfer circuit of the GOA unit at the previous level, and a first end of the third transistor T3 is configured to input the first control signals V1. A control end of the fourth transistor T4 connects to the output end of the down-transfer circuit of the GOA unit at the previous level, a first end of the fourth transistor T4 connects a second end of the third transistor T3, and a second end of the fourth transistor T4 connects to the control end of the first transistor T1. A control end of the fifth transistor T5 connects to the control end of the first transistor T1, a first end of the fifth transistor T5 connects to the second end of the first transistor T1, and a second end of the fifth transistor T5 connects to the second end of the third transistor T3.

The second switch unit Tb may include: a sixth transistor T6, a seventh transistor T7, and an eighth transistor T8. A control end of the sixth transistor T6 connects to the output end of the down-transfer circuit of the GOA unit at the next level, a first end of the sixth transistor T6 is configured to input the second control signals V2. A control end of the seventh transistor T7 connects to the output end of the down-transfer circuit of the GOA unit at the next level, a first end of the seventh transistor T7 connects a second end of the sixth transistor T6, and a second end of the seventh transistor T7 connects to the control end of the first transistor T1. A control end of the eighth transistor T8 connects to the control end of the first transistor T1, a first end of the eighth transistor T8 connects to the second end of the first transistor T1, and a second end of the eighth transistor T8 connects to a second end of the third transistor T3.

The third switch unit Tc may include: a sixteenth transistor T16, a seventeenth transistor T17, and an eighteenth transistor T18. A control end of the sixteenth transistor T16 connects to the second end of the twelfth transistor T12, and a first end of the sixteenth transistor T16 is configured to input the second low potential signals VSS2. A control end of the seventeenth transistor T17 connects to the second end of the twelfth transistor T12, a first end of the seventeenth transistor T17 connects to a second end of the sixteenth transistor T16, and a second end of the seventeenth transistor T17 connects to the control end of the first transistor T1. A control end of the eighteenth transistor T18 connects to the control end of the first transistor T1, a first end of the eighteenth transistor T18 connects to the second end of the first transistor T1, and a second end of the eighteenth transistor T18 connects to the second end of the sixteenth transistor T16.

In view of the above, the first switch unit Ta may include the third transistor t3, the fourth transistor T4, and the fifth transistor T5. The second switch unit Tb may include the sixth transistor T6, the seventh transistor T7, and the eighth transistor T8. The third switch unit Tc may include the sixteenth transistor T16, the seventeenth transistor T17, and the eighteenth transistor T18. The first low potential signals VSS1 and the second low potential signals VSS2 may be adopted. As such, Vgs of some key switches may be set to be less than zero, so as to prevent the GOA circuit from circuit-leakage.

That is, the first low potential signals VSS1 may be less than the second low potential signals VSS2.

Figure 5:
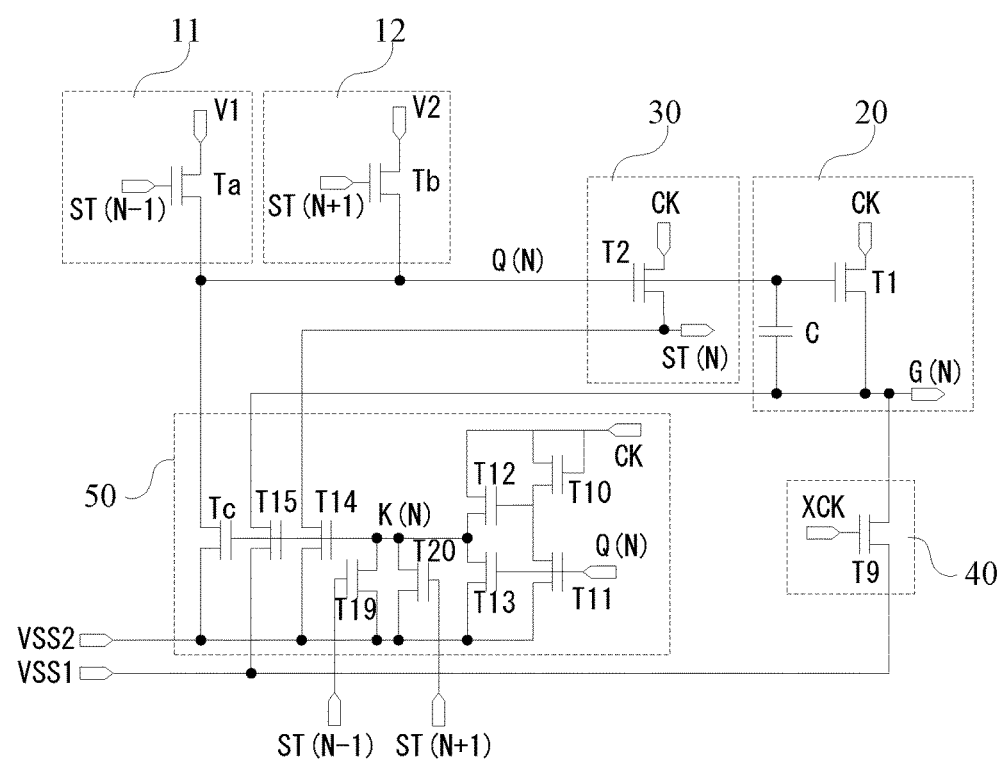
FIG. 5 is a schematic view of a scanning-driving circuit in accordance with another embodiment of the present disclosure.

In another example, referring to FIG. 5, the present disclosure relates to the scanning-driving circuit, including a plurality of the GOA units. Each of the GOA units may include the controlling circuit 10, the pull-up circuit 20, the down-transfer circuit 30, the pull-down circuit 40, and the pull-down maintaining unit 50.

The controlling circuit 10, the pull-up circuit 20, the down-transfer circuit 30, and the pull-down circuit 40 are the same with that of the embodiment described in above.

The pull-down maintaining circuit 50 may further include: a nineteenth transistor T19 and a twentieth transistor T20. A control end of the nineteenth transistor T19 connects to the output end of the down-transfer circuit at the previous level, which is configured to input the level-transfer signals ST(N−1), a first end of the nineteenth transistor T19 is configured to input the second low potential signals VSS2, and a second end of the nineteenth transistor T19 connects to the second end of the twelfth transistor T12. A control end of the twentieth transistor T20 connects to the output end of the down-transfer circuit at the next level, which is configured to input the level-transfer signals ST(N+1), a first end of the twentieth transistor T20 is configured to input the second low potential signals VSS2, and a second end of the twentieth transistor T20 connects to the second end of the twelfth transistor T12.

In view of the above, the pull-down maintaining circuit 50 may further include: the nineteenth transistor T19 and the twentieth transistor T20. The level-transfer signals ST(N−1) and the level-transfer signals ST(N+1) may be adopted to pull-down the potential of a null K(N). As such, failures resulting from negative bias of Vth of the transistors may be avoided.

In one example, the embodiments of the present disclosure shown in FIG. 4 and FIG. 5 may be combined, and may not be described here.

Figure 6:
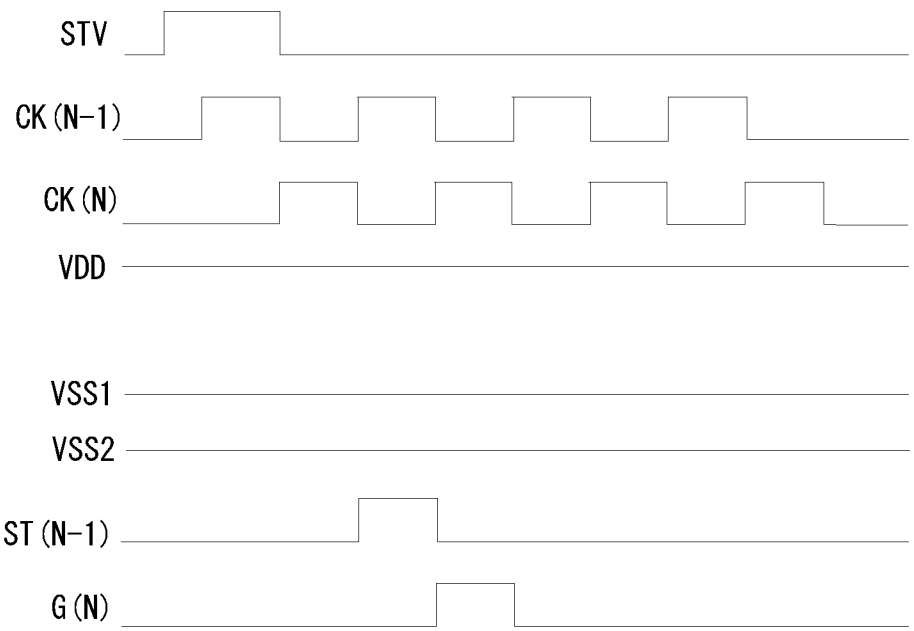
FIG. 6 is a timing diagram illustrating timings of forward scanning process conducted by a scanning-driving circuit.
Figure 7:
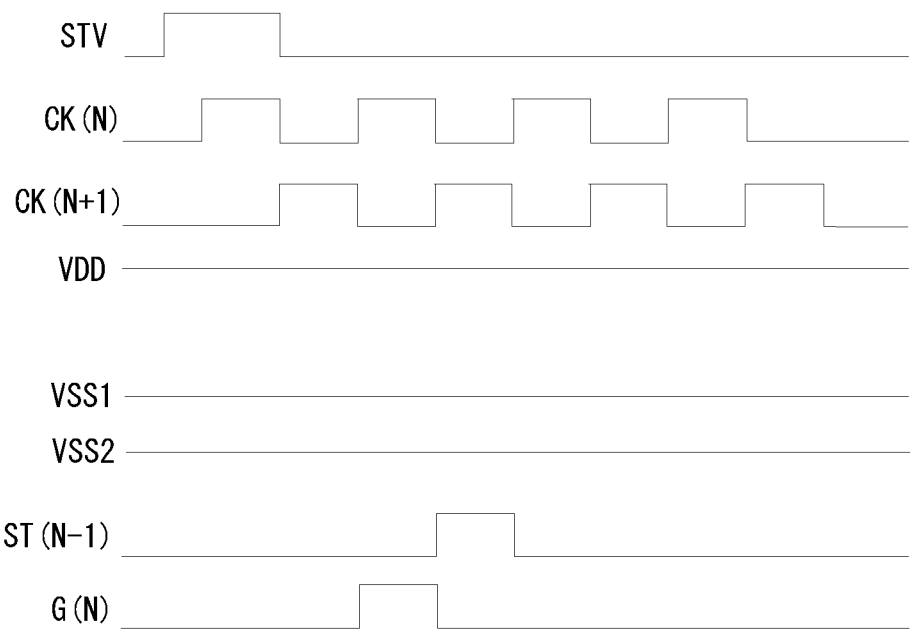
FIG. 7 is a timing diagram illustrating timings of backward scanning process conducted by a scanning-driving circuit.

FIG. 6 is a timing diagram illustrating timings of the forward scanning process of the scanning-driving circuit. FIG. 7 is a timing diagram illustrating the timings of the backward scanning process of the scanning-driving circuit. The principle of the circuit is further explained accompanying with FIGS. 3 to 7.

In one example, the transistors may adopt TFTs made by indium gallium zinc oxide (IGZO) material. The transistor may include a gate, a drain, and a source.

As shown in FIG. 6, when conducting the forward scanning process, the first control signals V1 may be the high potential signals VDD, the second control signals V2 may be the low potential signals VSS1 or VSS2. Activating signals may be inputted from STV to the gate of the third transistor T3 and the fourth transistor T4 at the first level of the GOA unit. The first control signals VDD may input the high potential signals. The third transistor T3 and the fourth transistor T4 may be turned on, and are configured to be pull-up transistors. The gates of the third transistor T3 and the fourth transistor T4 at normal levels, other than the first level, connect to the down-transfer signals ST(N−1), and the drain of the third transistor T3 connects to VDD. As such, the third transistor T3 and the fourth transistor T4 are configured to pull-up the transistors. The gates of the sixth transistor T6 and the seventh transistor T7 at the normal levels connect to the down-transfer signals ST(N+1), and the gate of the seventh transistor T7 at the last level and the seventh transistor T7 connect to STV signals. The sources of the sixth transistor T6 at each of the levels connect to low potential signals VSS (VSS1 or VSS2), and the low potential signals may be inputted. The sixth transistor T6 and the seventh transistor T7 are configured to pull-down the transistors. As such, the circuit signal are received in a forward scanning mode, that is, ST(N−1)→ST(N)→ST(N+1).

As shown in FIG. 7, when conducting the backward scanning process, the first control signals V1 may be the low potential signals VSS1 or VSS2, and the second control signals V2 may be the high potential signals VDD. The activating signals may be inputted from STV to the gate of the sixth transistor T6 and the seventh transistor T7. The source of the sixth transistor T6 connects to VDD. The sixth transistor T6 and the seventh transistor T7 are configured to pull-up the transistors. The drains of the third transistor T3 at each of the levels connect to VSS. The third transistor T3 and the fourth transistor T4 are configured to pull-down the transistors. As such, the circuit signals are received in a backward scanning mode, that is, ST(N+1)→ST(N)→ST(N−1).

Figure 8:
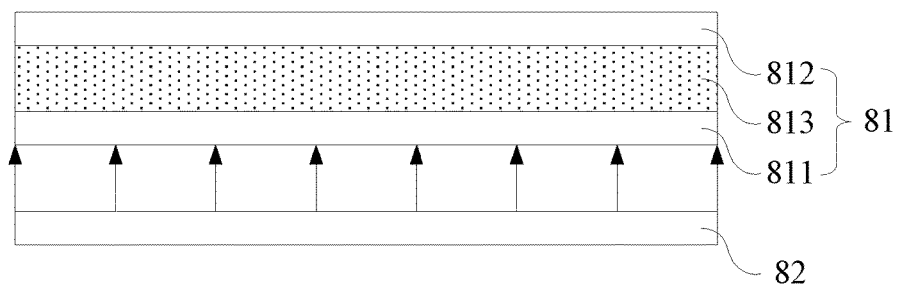
FIG. 8 is a schematic view of a liquid crystal display (LCD) in accordance with one embodiment of the present disclosure.

Referring to FIG. 8, the present disclosure relates to a display device, including a display panel 81 and a back light 82. The display panel 81 may include a array substrate 811, a color film substrate 812, and a liquid crystal layer 813 configured between the array substrate 811 and the color film substrate 812.

The scanning-driving circuit may be configured on the array substrate 811. The scanning-driving circuit may include the circuit described in above. The structure and operating principle of the circuit are similar to the embodiment described in above, and may not be described again.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A liquid crystal display (LCD), comprising:
   a scanning-driving circuit, comprising:
   a plurality of cascaded-connected gate driver on array (GOA) units, wherein each of the GOA units comprises a pull-up circuit, a controlling circuit, a down-transfer circuit, a pull-down circuit, and a pull-down maintaining unit, and the controlling circuit comprises a first controlling circuit and a second controlling circuit;
   when conducting a forward scanning process, the first controlling circuit is configured to turn on the pull-up circuit upon the scanning process has started, and the second controlling circuit is configured to turn off the pull-up circuit upon the scanning process has finished;
   when conducting a backward scanning process, the second controlling circuit is configured to turn on the pull-up circuit upon the scanning process has started, and the first controlling circuit is configured to turn off the pull-up circuit upon the scanning process has finished;
   the pull-up circuit comprises:
   a first transistor, wherein a control end of the first transistor connects to the first controlling circuit and the second controlling circuit, a first end of the first transistor is configured to input first clock signals, and a second end of the first transistor is configured to output scanning signals;
   a bootstrap capacitor, a first end of the bootstrap capacitor connects to the control end of the first transistor, and a second end of the bootstrap capacitor connects to the second end of the first transistor;
   the down-transfer circuit comprises a second transistor, wherein a control end of the second transistor connects to the first controlling circuit and the second controlling circuit, a first end of the second transistor is configured to input the first clock signals, and a second end of the second transistor outputs down-transfer signals;
   wherein the first transistor and the second transistor are thin film transistors (TFTs) made of indium gallium zinc oxide (IGZO) material;
   wherein the pull-down maintaining circuit comprises:
   a tenth transistor, wherein a control end of the tenth transistor is configured to input the first clock signals;
   an eleventh transistor, a control end of the eleventh transistor connects to the control end of the first transistor, a first end of the eleventh transistor is configured to input second low potential signals, and a second end of the eleventh transistor connects to a second end of the tenth transistor;
   a twelfth transistor, a control end of the twelfth transistor connects to the second end of the tenth transistor, a first end of the twelfth transistor is configured to input the first clock signals;

a thirteenth transistor, a control end of the thirteenth transistor connects to the control end of the first transistor, a first end of the thirteenth transistor is configured to input the second low potential signals, and a second end of the thirteenth transistor connects to a second end of the twelfth transistor;

a fourteenth transistor, a control end of the fourteenth transistor connects to the second end of the twelfth transistor, a first end of the fourteenth transistor is configured to input the second low potential signals, and a second end of the fourteenth transistor connects to the second end of the second transistor;

a fifteenth transistor, a control end of the fifteenth transistor connects to the second end of the twelfth transistor, a first end of the fifteenth transistor is configured to input the first low potential signals, and a second end of the fifteenth transistor connects to the second end of the first transistor;

a third switch unit, a control end of the third switch unit connects to the second end of the twelfth transistor, a first end of the third switch unit is configured to input the second low potential signals, and a second end of the third switch unit connects to the control end of the first transistor.

2. The LCD according to claim 1, wherein the first controlling circuit comprises:

a first switch unit, wherein a control end of the first switch unit connects to an output end of the down-transfer circuit of a GOA unit at a previous level, a first end of the first switch unit is configured to input the first control signals, and a second end of the first switch unit connects to the control end of the first transistor;

wherein the control end of the first switch unit of the GOA unit at a first level is configured to input STV signals;

the second controlling circuit comprises:

a second switch unit, a control end of the second switch unit connects to an input end of the down-transfer circuit of the GOA at a next level, a first end of the second switch unit is configured to input second control signals, and a second end of the second switch unit connects to the control end of the first transistor;

wherein the control end of the second switch unit of the GOA unit at a last level is configured to input the STV signals.

3. The LCD according to claim 2, wherein the first switch unit comprises:

a third transistor, a control end of the third transistor connects to the output end of the down-transfer circuit of the GOA unit at the previous level, and a first end of the third transistor is configured to input the first control signals;

a fourth transistor, a control end of the fourth transistor connects to the output end of the down-transfer circuit of the GOA unit at the previous level, a first end of the fourth transistor connects a second end of the third transistor, and a second end of the fourth transistor connects to the control end of the first transistor;

a fifth transistor, a control end of the fifth transistor connects to the control end of the first transistor, a first end of the fifth transistor connects to the second end of the first transistor, and a second end of the fifth transistor connects to the second end of the third transistor.

4. The LCD according to claim 2, wherein the second switch unit comprises:

a sixth transistor, a control end of the sixth transistor connects to the output end of the down-transfer circuit of the GOA unit at the next level, a first end of the sixth transistor is configured to input the second control signals;

a seventh transistor, a control end of the seventh transistor connects to the output end of the down-transfer circuit of the GOA unit at the next level, a first end of the seventh transistor connects a second end of the sixth transistor, and a second end of the seventh transistor connects to the control end of the first transistor;

an eighth transistor, a control end of the eighth transistor connects to the control end of the first transistor, a first end of the eighth transistor connects to the second end of the first transistor, and a second end of the eighth transistor connects to a second end of the third transistor.

5. The LCD according to claim 1, wherein the pull-down circuit comprises:

a ninth transistor, a control end of the ninth transistor is configured to input second clock signals, a first end of the ninth transistor is configured to input first low potential signals, and a second end of the ninth transistor connects to the second end of the first transistor.

6. The LCD according to claim 1, wherein the third switch unit comprises:

a sixteenth transistor, a control end of the sixteenth transistor connects to the second end of the twelfth transistor, and a first end of the sixteenth transistor is configured to input second low potential signals;

a seventeenth transistor, a control end of the seventeenth transistor connects to the second end of the twelfth transistor, a first end of the seventeenth transistor connects to a second end of the sixteenth transistor, and a second end of the seventeenth transistor connects to the control end of the first transistor;

an eighteenth transistor, a control end of the eighteenth transistor connects to the control end of the first transistor, a first end of the eighteenth transistor connects to the second end of the first transistor, and a second end of the eighteenth transistor connects to the second end of the sixteenth transistor.

7. The LCD according to claim 1, wherein the pull-down maintaining circuit further comprises:

a nineteenth transistor, a control end of the nineteenth transistor connects to the output end of the down-transfer circuit at a previous level, a first end of the nineteenth transistor is configured to input the second low potential signals, and a second end of the nineteenth transistor connects to the second end of the twelfth transistor;

a twentieth transistor, a control end of the twentieth transistor connects to the output end of the down-transfer circuit at a next level, a first end of the twentieth transistor is configured to input the second low potential signals, and a second end of the twentieth transistor connects to the second end of the twelfth transistor.

8. A scanning-driving circuit, comprising:

a plurality of cascaded-connected GOA units, wherein each of the GOA units comprises a pull-up circuit, a controlling circuit, a down-transfer circuit, a pull-down circuit, and a pull-down maintaining unit, and the controlling circuit comprises a first controlling circuit and a second controlling circuit;

when conducting a forward scanning process, the first controlling circuit is configured to turn on the pull-up circuit upon the scanning process has started, and the second controlling circuit is configured to turn off the pull-up circuit upon the scanning process has finished;

when conducting a backward scanning process, the second controlling circuit is configured to turn on the pull-up circuit upon the scanning process has started, and the first controlling circuit is configured to turn off the pull-up circuit upon the scanning process has finished;

wherein the pull-up circuit comprises:

a first transistor, a control end of the first transistor connects to the first controlling circuit and the second controlling circuit, a first end of the first transistor is configured to input first clock signals, and a second end of the first transistor is configured to output scanning signals;

a bootstrap capacitor, a first end of the bootstrap capacitor connects to the control end of the first transistor, and a second end of the bootstrap capacitor connects to the second end of the first transistor;

the down-transfer circuit comprises a second transistor, wherein a control end of the second transistor connects to the first controlling circuit and the second controlling circuit, a first end of the second transistor is configured to input the first clock signals, and a second end of the second transistor outputs down-transfer signals;

wherein the pull-down maintaining circuit comprises:

a tenth transistor, a control end of the tenth transistor is configured to input the first clock signals;

an eleventh transistor, a control end of the eleventh transistor connects to the control end of the first transistor, a first end of the eleventh transistor is configured to input second low potential signals, and a second end of the eleventh transistor connects to a second end of the tenth transistor;

a twelfth transistor, a control end of the twelfth transistor connects to the second end of the tenth transistor, a first end of the twelfth transistor is configured to input the first clock signals;

a thirteenth transistor, a control end of the thirteenth transistor connects to the control end of the first transistor, a first end of the thirteenth transistor is configured to input the second low potential signals, and a second end of the thirteenth transistor connects to a second end of the twelfth transistor;

a fourteenth transistor, a control end of the fourteenth transistor connects to the second end of the twelfth transistor, a first end of the fourteenth transistor is configured to input the second low potential signals, and a second end of the fourteenth transistor connects to the second end of the second transistor;

a fifteenth transistor, a control end of the fifteenth transistor connects to the second end of the twelfth transistor, a first end of the fifteenth transistor is configured to input the first low potential signals, and a second end of the fifteenth transistor connects to the second end of the first transistor;

a third switch unit, a control end of the third switch unit connects to the second end of the twelfth transistor, a first end of the third switch unit is configured to input the second low potential signals, and a second end of the third switch unit connects to the control end of the first transistor.

9. The scanning-driving circuit according to claim 8, wherein the first controlling circuit comprises:

a first switch unit, a control end of the first switch unit connects to an output end of the down-transfer circuit of a GOA unit at a previous level, a first end of the first switch unit is configured to input the first control signals, and a second end of the first switch unit connects to the control end of the first transistor;

wherein the control end of the first switch unit of the GOA unit at a first level is configured to input STV signals;

the second controlling circuit comprises:

a second switch unit, a control end of the second switch unit connects to an input end of the down-transfer circuit of the GOA at a next level, a first end of the second switch unit is configured to input second control signals, and a second end of the second switch unit connects to the control end of the first transistor;

wherein the control end of the second switch unit of the GOA unit at a last level is configured to input the STV signals.

10. The scanning-driving circuit according to claim 9, wherein the first switch unit comprises:

a third transistor, a control end of the third transistor connects to the output end of the down-transfer circuit of the GOA unit at the previous level, and a first end of the third transistor is configured to input the first control signals;

a fourth transistor, a control end of the fourth transistor connects to the output end of the down-transfer circuit of the GOA unit at the previous level, a first end of the fourth transistor connects a second end of the third transistor, and a second end of the fourth transistor connects to the control end of the first transistor;

a fifth transistor, a control end of the fifth transistor connects to the control end of the first transistor, a first end of the fifth transistor connects to the second end of the first transistor, and a second end of the fifth transistor connects to the second end of the third transistor.

11. The scanning-driving circuit according to claim 9, wherein the second switch unit comprises:

a sixth transistor, a control end of the sixth transistor connects to the output end of the down-transfer circuit of the GOA unit at the next level, a first end of the sixth transistor is configured to input the second control signals;

a seventh transistor, a control end of the seventh transistor connects to the output end of the down-transfer circuit of the GOA unit at the next level, a first end of the seventh transistor connects a second end of the sixth transistor, and a second end of the seventh transistor connects to the control end of the first transistor;

an eighth transistor, a control end of the eighth transistor connects to the control end of the first transistor, a first end of the eighth transistor connects to the second end of the first transistor, and a second end of the eighth transistor connects to a second end of the third transistor.

12. The scanning-driving circuit according to claim 8, wherein the pull-down circuit comprises:

a ninth transistor, a control end of the ninth transistor is configured to input second clock signals, a first end of the ninth transistor is configured to input first low potential signals, and a second end of the ninth transistor connects to the second end of the first transistor.

13. The scanning-driving circuit according to claim 8, wherein the third switch unit comprises:

a sixteenth transistor, a control end of the sixteenth transistor connects to the second end of the twelfth transistor, and a first end of the sixteenth transistor is configured to input second low potential signals;

a seventeenth transistor, a control end of the seventeenth transistor connects to the second end of the twelfth transistor, a first end of the seventeenth transistor connects to a second end of the sixteenth transistor, and a second end of the seventeenth transistor connects to the control end of the first transistor;

an eighteenth transistor, a control end of the eighteenth transistor connects to the control end of the first transistor, a first end of the eighteenth transistor connects to the second end of the first transistor, and a second end of the eighteenth transistor connects to the second end of the sixteenth transistor.

14. The LCD The scanning-driving circuit according to claim 8, wherein the pull-down maintaining circuit further comprises:

a nineteenth transistor, a control end of the nineteenth transistor connects to the output end of the down-transfer circuit at a previous level, a first end of the nineteenth transistor is configured to input the second low potential signals, and a second end of the nineteenth transistor connects to the second end of the twelfth transistor;

a twentieth transistor, a control end of the twentieth transistor connects to the output end of the down-transfer circuit at a next level, a first end of the twentieth transistor is configured to input the second low potential signals, and a second end of the twentieth transistor connects to the second end of the twelfth transistor.

\* \* \* \* \*